United States Patent
Kizilyalli et al.

(10) Patent No.: US 6,602,758 B2
(45) Date of Patent: Aug. 5, 2003

(54) FORMATION OF SILICON ON INSULATOR (SOI) DEVICES AS ADD-ON MODULES FOR SYSTEM ON A CHIP PROCESSING

(75) Inventors: Isik C. Kizilyalli, Millburn, NJ (US); Joseph R. Radosevich, South Portland, ME (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/882,961

(22) Filed: Jun. 15, 2001

(65) Prior Publication Data

US 2002/0192956 A1 Dec. 19, 2002

(51) Int. Cl.[7] ............................................. H01L 21/76
(52) U.S. Cl. ...................... 438/424; 438/161; 438/151
(58) Field of Search ................................. 438/161, 151, 438/424

(56) References Cited

U.S. PATENT DOCUMENTS

| | | | |
|---|---|---|---|
| 4,559,102 A | * | 12/1985 | Hayafuji |
| 5,528,054 A | | 6/1996 | Ipposhi, et al. |
| 6,214,653 B1 | * | 4/2001 | Chen |
| 6,218,678 B1 | * | 4/2001 | Zhang et al. |
| 6,235,614 B1 | * | 5/2001 | Yang |
| 2001/0003364 A1 | * | 6/2001 | Sugawara et al. |

FOREIGN PATENT DOCUMENTS

| | | |
|---|---|---|
| EP | 0 179 719 A1 | 4/1986 |
| EP | 0 331 811 A2 | 9/1989 |
| GB | 2 266 993 A | 11/1993 |
| JP | 57023218 A | 2/1982 |

OTHER PUBLICATIONS

Giust, et al., "Comparison of excimer laser recrystallized prepatterned and unpatterned silicon films on $SiO_2$," J. Appl. Phys., Feb. 1997, pp. 1204–1211, vol. 81, No. 3, American Institute of Physics.

Song, et al., "Single–crystal Si islands on $SiO_2$ obtained via excimer–laser irradiation of a patterned Si film," Appl. Phys. Lett., May 1996, pp. 3165–3167, vol. 68, No. 22, American Institute of Physics.

Sposili, et al., "Sequential lateral solidification of thin silicon films on $SiO_2$," Appl. Phys. Lett., Nov. 1996, pp. 2864–2866, vol. 69, No. 19, American Institute of Physics.

GB Search Report for related GB Application No. 0213863.4, dated Feb. 19, 2003, 1 page.

* cited by examiner

Primary Examiner—John F. Niebling
Assistant Examiner—Stanetta Isaac
(74) Attorney, Agent, or Firm—Christie, Parker & Hale, LLP

(57) ABSTRACT

A method for forming single crystalline silicon-on-insulator (SOI) structures over a silicon substrate includes forming an amorphous silicon layer over an insulating layer and contacting the substrate through the insulating layer. An excimer laser having operating conditions and a wavelength chosen to selectively melt amorphous silicon irradiates the entire substrate surface and is largely non-absorbed by materials other than silicon when incident upon them. Heating of the substrate and other materials is therefore minimal. After a blanket radiation process selectively melts the amorphous silicon layer, cooling conditions are chosen such that a single crystal silicon film is formed during the solidification process due to contact to the single crystal silicon substrate which acts as a seed layer. Various devices may be formed on the SOI islands as well as on exposed portions of the substrate not covered by the SOI islands.

20 Claims, 4 Drawing Sheets

FORMATION OF SILICON ON INSULATOR (SOI) DEVICES AS ADD-ON MODULES FOR SYSTEM ON A CHIP PROCESSING

FIELD OF THE INVENTION

The present invention relates, most generally, to semiconductor devices and methods for manufacturing the same. More particularly, the present invention relates to a method and structure for forming modular silicon-on-insulator islands on a semiconductor substrate.

BACKGROUND OF THE INVENTION

In today's semiconductor manufacturing industry, silicon-on-insulator (SOI) technology has emerged as a preferred manufacturing method. Devices formed within silicon-on insulator modules are electrically isolated from other devices formed in the substrate and suffer less from noise effects than the conventional technology which includes devices formed directly on a common substrate. Because of the relative noise immunity of the silicon on insulator devices, these devices are high performance devices which can operate at desirably low operating voltages. This low operating voltage advantage is particularly favorable in digital signal processing (DSP) applications. Furthermore, there is little or no cross-talk between a device formed on one isolated SOI island and a device formed on another isolated SOI island or the semiconductor substrate beneath the island. Additionally, SOI devices are essentially immune to radiation effects.

In SOI technology, single-crystal silicon is the preferred silicon material. Single crystal silicon includes a single-crystalline, ordered grain structure which is free of dislocations and therefore can accommodate high surface charges in transistors and other devices. Polycrystalline silicon (polysilicon) is less favored because of random grain boundaries and an inherently disordered grain structure. When thin film transistors (TFT's) are formed in polycrystalline silicon, higher operating voltages are needed. It is well known in the art that lower operating voltages are desirable.

Conventional techniques for forming SOI structures include epitaxial growth of a continuous single crystalline film over a substrate which includes an insulating layer. Another technique is a thermal technique which involves vertical and lateral growth of single crystalline grains as a result of contact to a seed layer of single crystalline silicon such as the substrate over which it is formed. Such techniques include the shortcoming that the entire substrate must be heated to first melt the non-single crystal silicon film so that it may cool and solidify into a single-crystalline film structure. Elevated temperatures are undesirable because they can cause the undesired melting of other structures on the semiconductor substrate and can urge the undesired diffusion of spatially sensitive species from a desired area to an undesired area. Either of these undesired effects can cause device failure. As such, it is desirable to form single crystal silicon structures over a substrate without causing the undesired diffusion and melting of various structures within the substrate due to the entire substrate being subjected to an elevated temperature.

It is also desirable to form modular single crystal SOI islands in selective regions of a semiconductor substrate while also maintaining other regions of the semiconductor substrate on which to directly form conventional semiconductor devices such as CMOS devices, for example. The simultaneous formation of both conventional and SOI devices on the same semiconductor substrate provides new avenues of opportunities for forming a multiplicity of various circuits and devices on a single semiconductor substrate. Furthermore, it would be desirable to employ both CMOS processing technology to form CMOS structures and circuits on a chip while also employing SOI processing technology to form SOI structures on the same chip.

In view of the above shortcomings and responsive to present needs of semiconductor processing technology, it would therefore be desirable to provide a method and structure for providing modular SOI islands on a chip which are large enough to accommodate semiconductor devices formed thereon while also maintaining portions of the same chip for conventional CMOS processing and device formation. It would further be desired to form such a structure using a process which does not require elevated temperatures throughout the substrate such as may adversely affect or destroy other device features. The present invention addresses these needs.

SUMMARY OF THE INVENTION

To achieve these and other objects, and in view of its purposes, the present invention provides a method for forming modular SOI islands over a semiconductor substrate. The use of isolated SOI islands suppresses noise and minimizes cross-talk between devices. The present invention also provides utilizing other sections of the semiconductor substrate for the formation of conventional semiconductor devices such as CMOS devices, formed directly on the substrate. The method induces providing a silicon substrate with a trench therein, then forming an insulating layer over the substrate and within the trench, but not extending to the top of the trench, the insulating layer therefore including at least one opening exposing a sidewall of the trench, each sidewall corresponding to a substrate contact area. An amorphous silicon layer is formed over the insulating layer and within the trench, and contacting the contact area of the substrate. The amorphous silicon layer is converted to substantially single crystal silicon as the substrate is subjected to laser irradiation which includes operating conditions chosen to selectively melt only the exposed amorphous silicon. Advantageously, an excimer laser is used. Other structures and regions of the substrate exposed to the laser radiation either are non-absorptive to the radiation or are not heated to a point at which defects occur. After the blanket exposure of the substrate to laser irradiation has been used to selectively melt only the amorphous silicon, the laser annealing process continues as established solidification principles are used and cooling conditions chosen to utilize the portion of the semiconductor substrate contacted by the amorphous silicon film as a seed layer to produce the ordered, substantially single-crystalline silicon film. The single-crystalline silicon film thereby formed over the insulating layer, may be patterned to form electrically isolated SOI islands upon which devices can be formed.

BRIEF DESCRIPTION OF THE DRAWING

The present invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Included in the drawing are the following figures.

FIG. 1G shows a first exemplary structure of the present invention; and, FIGS. 2A–2F are cross-sectional views showing another exemplary process sequence of the method of the present invention.

Like numbers denote like elements throughout the figures and text.

DETAILED DESCRIPTION OF THE INVENTION

The present invention provides a method for forming a silicon film, preferably an amorphous silicon film, over an insulating layer formed over a silicon substrate. The silicon film contacts the silicon substrate preferably through openings formed in the insulating layer. The silicon film may be patterned to remove portions of the film while retaining discrete sections of the film, each of which contacts the silicon substrate. In regions where the silicon film has been removed, the insulating layer may additionally be removed thereby exposing portions of the silicon substrate.

The substrate then undergoes a selective laser annealing process which includes irradiating the entire surface of the substrate using an excimer laser. The laser irradiation properties such as specific type of laser, wavelength of radiation, energy level, pulse duration and frequency, number of pulses and fluence, are chosen in conjunction with the thickness of the silicon film and the other exposed materials, such that substantially all of the amorphous silicon film is melted while other exposed regions of the substrate are either non-absorptive or are not heated past the critical point of heating. The spatially homogenized beam includes a beam size chosen to be large enough to blanket expose the entire substrate. This may be done in a single exposure or the laser beam may scan the surface to irradiate the complete substrate. A masking feature to spatially limit or direct the laser beam, is not needed. After the amorphous silicon is heated past its melting temperature, the cooling conditions are chosen so that the solidification process utilizes the contacted single-crystalline silicon substrate as a seed layer thereby urging the melted amorphous silicon film to cool and solidify into a single-crystalline structure with ordered grains, such as a <100> single crystalline silicon structure.

After the solidification process, sections of the converted crystalline silicon film which are in contact with the silicon substrate, are preferably removed to produce electrically isolated SOI islands of single crystal silicon. In various other regions, the surface of underlying substrate is exposed. The SOI islands and exposed substrate regions are sized such that various devices may be formed in each of the exposed regions of the substrate and the electrically isolated SOI islands. In the preferred embodiment, devices may be formed on both the exposed substrate regions and the SOI islands, within the same chip. In this manner, a modular arrangement of SOI islands and exposed substrate, is achieved.

Figure 1A:
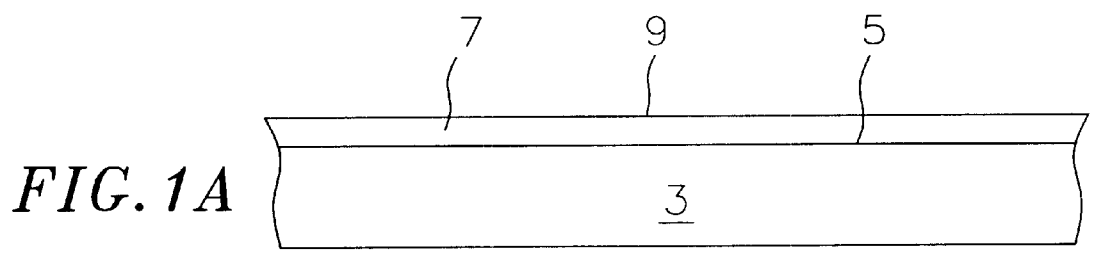
FIGS. 1A–1G are cross-sectional views showing an exemplary process sequence of the method of the present invention.

Now turning to the figures, FIGS. 1A–1G are cross-sectional views showing an exemplary sequence of process operations used to form modular SOI islands according to the above-described general method. FIG. 1A shows substrate 3, formed of single crystal silicon. In the preferred embodiment, the lattice structure of the single crystalline silicon may be a <100> silicon orientation, but a <111> crystal lattice structure may be used alternatively. Insulating layer 7 is formed over substrate surface 5. Insulating layer 7 includes top surface 9 and may be any of various conventionally used insulating layers such as doped or undoped silicon dioxide. Other insulating layers may alternatively be used as insulating layer 7.

Figure 1B:
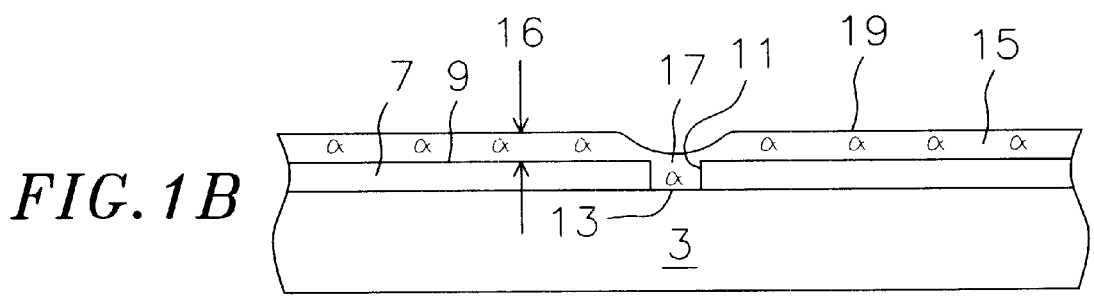

FIG. 1B shows opening 11 formed in insulating layer 7. Opening 11 may be formed using any of various conventional means such as by patterning using a photosensitive film, then etching opening 11 using reactive ion etching techniques. Other methods may be used alternatively. Opening 11 exposes substrate contact 13 which provides contact to substrate 3. After opening 11 is formed, amorphous silicon film 15 is formed over insulating layer 7 and within opening 11 such that adjacent portion 17 of amorphous silicon film 15 contacts substrate contact 13 in opening 11. Although shown and described in terms of a single opening 11 formed through insulating layer 7 to provide contact to substrate 3, according to other exemplary embodiments, a plurality of openings 11 may be formed to provide contact. Various suitable methods may be used to form amorphous silicon film 15. According to various exemplary embodiments, CVD (chemical vapor deposition), PVD (physical vapor deposition) or PECVD (plasma enhanced CVD) techniques using silane gas, $SiH_4$ may be used. Thickness 16 of amorphous silicon film 15 is chosen in conjunction with the processing parameters which will be used for irradiating the surface with laser light. Thickness 16 will be chosen such that the entire depth of amorphous silicon film 15 will be melted when irradiated by the laser light, and subsequently cooled to a continuous crystal silicon material. Amorphous silicon film 15 includes upper surface 19.

Figure 1C:
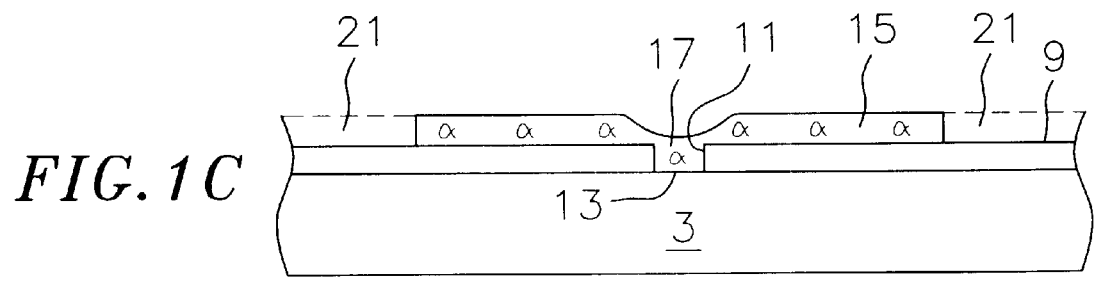

Now turning to FIG. 1C, portions 21 (indicated by the ghost pattern of dashed lines) of amorphous silicon film 15 are preferably removed. Conventional patterning and etching techniques may be used. After portions 21 of amorphous silicon film 15 have been removed thereby exposing top surface 9 of insulating layer 7, portions of insulating layer 7 may also be removed to expose sections of substrate 3 as shown in exemplary FIG. 1D.

Figure 1D:
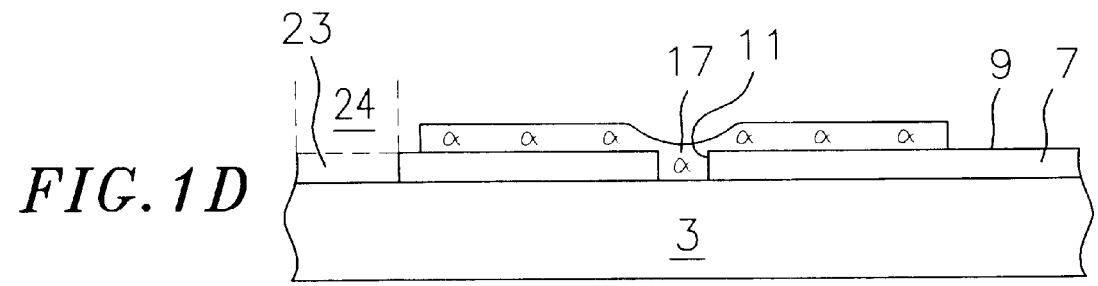

FIG. 1D shows portion 23 (indicated by the ghost pattern of dashed lines) of insulating layer 7 removed in region 24. Conventional patterning and etching techniques may be used to remove portion 23 and expose substrate surface 5 of substrate 3 in region 24. In the preferred embodiment, this operation may be deferred until after amorphous silicon film 15 has been converted to a single crystalline film. If the removal of exemplary portion 23 of insulating layer 7 is deferred until after amorphous silicon film 15 is converted to a single crystalline silicon film, then no substrate silicon will be exposed during the laser annealing process. This is preferred since the laser irradiation conditions will be chosen to preferably emit light radiation having a wavelength at the absorption peak of silicon. The radiation is preferably absorbed by silicon thereby heating the silicon. Removal of portion 23 is not precluded at this time, however, because amorphous silicon film 15 melts at a significantly lower temperature, approximately 950° C., than does the single crystalline silicon of the silicon substrate. As such, while the amorphous silicon advantageously melts, the crystalline silicon substrate is heated below its critical temperature and remains substantially undisturbed during the subsequent laser annealing process. Also prior to the laser annealing process, various other structures and devices (not shown) may be formed in or on other regions of substrate 3.

Figure 1E:
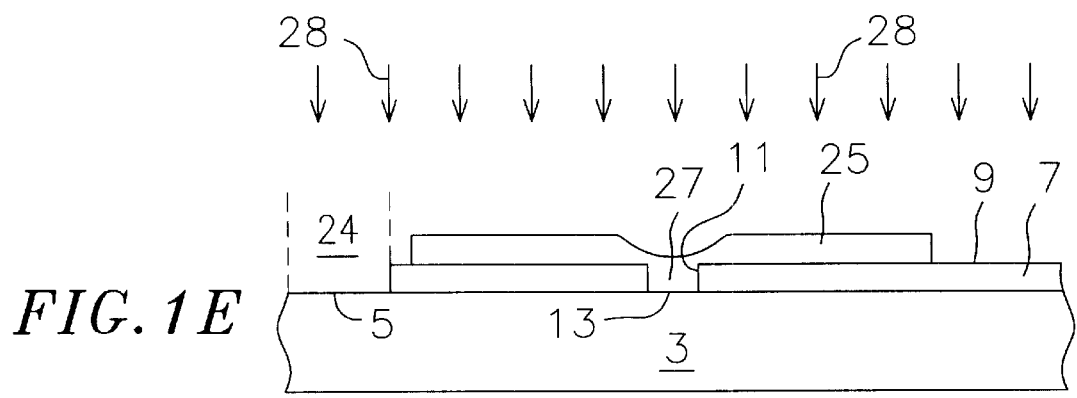

Now turning to FIG. 1E, the structure is irradiated with laser light 28. Although shown in a substantially vertical direction with respect to horizontal substrate 3, laser light 28 may be directed to the exposed surface from above, at various angles. The beam size of the laser is chosen such that the entire substrate 3 may be simultaneously irradiated by a laser beam which is preferably spatially homogenous. According to other embodiments, the beam is scanned over the entire substrate surface. By exposing the substrate surface with laser light or a laser beam, it is meant that the laser light is incident upon substrate surface 5 and materials and structures formed thereover. Masking or spatially limiting techniques are not necessary. In the preferred embodiment, an excimer laser is used. Also in the preferred embodiment, laser irradiation 28 may be provided using an XeCl excimer laser which emits light having a wavelength of 308 nm. According to other exemplary embodiments, other excimer lasers such as an ArF laser operating at 193 nm or a KrF laser operating at 248 nm may be used alternatively. Pulse duration of the laser may vary and may range from 10–30 nanoseconds in an exemplary embodiment. Single or multiple pulses may be used. Various repetition rates may be used for multiple-pulsed embodiments. In an exemplary embodiment, a repetition rate of 5 Hz may be used. The preferred radiation source is a Q-switched excimer laser which emits radiation at a wavelength at or near the absorption peak of silicon, 308 nm. This radiation wavelength is selected to also be non-absorptive when incident upon other materials formed on the wafer substrate so that substantially smaller or no temperature elevation occurs in regions where higher temperatures could degrade materials properties, cause unwanted diffusion, or degrade device performance. Various energy fluences may be used depending on the number, frequency, and duration of pulses, the thickness of amorphous silicon film 15, and the various structures and films exposed on the substrate. According to various exemplary embodiments, energy fluences ranging from 100 to 600 mJ/cm$^2$ may be used. An advantage of the present invention is that various other structures and/or impurity regions may be formed or introduced into the substrate prior to the laser irradiation step. This is particularly true if they are formed under non-absorptive insulating layer 7. Since amorphous silicon film 15 melts at a temperature (950° C.) much less than the melting temperature of single crystal silicon, the radiation energy is controlled to maintain heating of the silicon substrate below its critical melting temperature.

During the laser irradiation, the entire thickness of amorphous silicon film 15 is heated by laser radiation at or near the absorption peak of silicon which causes the entire profile of amorphous silicon film 15 to melt. After the entirety of amorphous silicon film 15 including adjacent portion 17 melts, it is then allowed to cool. The solidification conditions such as the cooling time and temperature gradients are chosen and controlled such that substrate contact 13 acts as a seed urging the silicon film to solidify and form single crystal silicon film 25 upon solidification. Conventional means for controlling the cool-down, may be used. In the preferred embodiment in which substrate 3 includes a <100> crystalline lattice, single crystal silicon film 25 will be formed to also include a <100> crystalline lattice. In exemplary embodiments in which <111> silicon is used as substrate 3, single crystal silicon film 25 will include a <111> crystalline lattice. Amorphous silicon film 15 is thereby converted to single crystal silicon film 25 which includes adjacent portion 27.

Figure 1F:
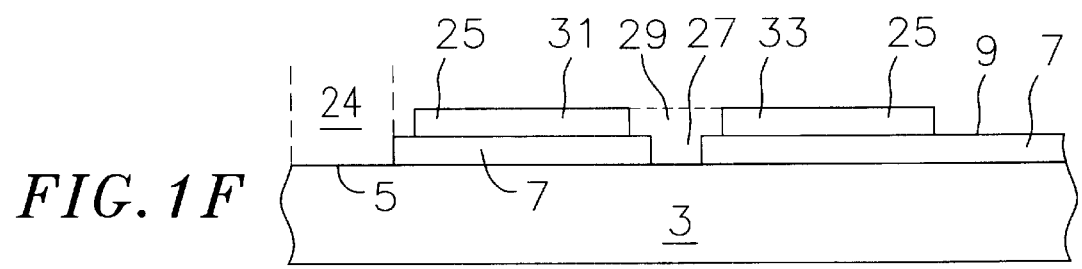

Now referring to FIG. 1F, sections 29 (indicated by the dashed lines) of single crystal silicon film 25 are removed using conventional methods. Various patterning and etching techniques may be used to remove section 29 including adjacent portion 27 which had previously provided contact to substrate 3. Such removal produces electrically isolated SOI islands 31 and 33 of single crystal silicon film 25. Electrically isolated SOI islands 31 and 33 are sized to enable various semiconductor devices to be formed therein or thereon.

Figure 1G:
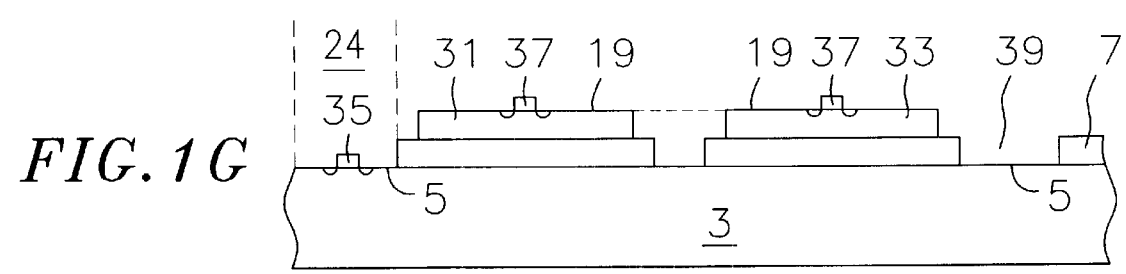

Now turning to FIG. 1G, additional regions such as exemplary region 39 of insulating layer 7 may optionally be removed at this point. Conventional methods may be used. Portions of substrate surface 5 may optionally have already been exposed such as in region 24. Regardless of the sequence used, at this point, each of islands 31 and 33 of single crystal silicon film 25 and regions of substrate surface 5 are exposed and sized to accommodate devices being formed therein or thereon. Exemplary devices 37 are shown formed on crystal silicon film 25 and exemplary device 35 is shown as being formed on substrate surface 5. It should be emphasized at this point that devices 35 and 37 are intended to be exemplary only and that various other devices, device features, and circuits may be formed utilizing sections of exposed substrate 3, SOI islands 31 and 33, or both. Devices formed on SOI islands such as islands 31 and 33 are electrically isolated from the substrate and the other SOI islands, suffer from a minimal of cross-talk, enjoy suppressed noise characteristics, are less prone to radiation effects and can operate at relatively low operating voltages because they are formed in a silicon material having an ordered grain structure with reduced grain defects. Such a single crystal material is a superior acceptor of dopant impurities and is resistant to undesirable out-diffusion of dopant species from their desired interstitial positions in the crystal lattice. Various CMOS and other devices and circuits may be found on substrate surface 5. In an exemplary embodiment, devices 37 and 35 and islands 31 and 31 as well as exposed portions of substrate surface 5, may be formed on the same chip.

FIGS. 2A–2F are cross-sectional views showing another exemplary embodiment of a sequence of process operations used to form isolated SOI islands according to the present invention. Again, the reader is reminded that like reference numbers refer to like elements throughout the figures and text. Similarly, like operations are as described in conjunction with the embodiment shown in FIGS. 1A–1G. The structure of the second exemplary embodiment shown in FIGS. 2A–2F is distinguished from the exemplary embodiment shown in FIGS. 1A–1G in that the SOI island is formed in a trench opening formed in the substrate and may ultimately include an upper surface substantially planar with the substrate surface. Additionally, in the process sequence used to form the SOI island(s) within the trench, the amorphous silicon film contacts the substrate laterally through sidewalls of the trench opening which act as the seed point which influences the silicon film to be converted to a single crystalline film during the cooling/solidification process.

Figure 2A:
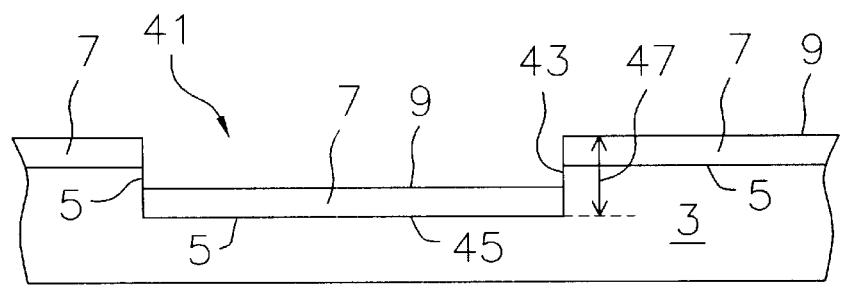
FIG. 2F shows a second exemplary structure of the present invention.

FIG. 2A shows trench 41 formed within substrate 3. Trench 41 may be formed using suitable conventional methods for forming trenches in silicon substrates. After trench 41 is formed, insulating layer 7 is formed over substrate surfaces 5 using conventional methods. Conventional processing techniques such as a patterning/etching sequence is used to selectively remove portions of insulating layer 7 to expose sidewalls 43 of trench 41. According to various exemplary embodiments, additional portions of insulating layer 7 may additionally be removed or receded from exposed sidewalls 43 to expose additional portions of substrate 3 either within or above trench 41. This will increase the contact area between the amorphous silicon film formed over the structure shown in FIG. 2A, and substrate 3. Prior to formation of the amorphous silicon film, then, insulating layer 7 within trench 41 does not extend up to the top of the isolation trench; rather, exposed sidewalls 43 represent portions of the trench sidewall not bounded by insulating layer 7. According to the various exemplary embodiments, an amorphous silicon film formed over the structure shown in FIG. 2A will include direct contact with substrate surface 5 of substrate 3 through an opening or openings formed within insulating layer 7 such as the opening to expose sidewall 43 of trench 41 shown in FIG. 2A. According to another exemplary embodiment, an opening may additionally or alternatively be formed through insulating layer 7 to provide contact to base 45 of trench 41.

Depth 47 of base 45 of trench 41 below top surface 9, may differ in various exemplary embodiments. Depth 47 is chosen in conjunction with the thickness of the amorphous silicon film to be formed over the structure. According to various other exemplary embodiments (not shown), additional films such as a silicon nitride film and an additional insulating layer such as silicon dioxide, may also be formed over substrate surface 5 prior to trench formation and remain on the surface in the non-trench regions. According to exemplary embodiments with additional films, depth 47 will be increased by the thickness of the deposited films. Such exemplary embodiments including a silicon nitride film in particular, find particular advantage in subsequent polishing operations such as chemical mechanical polishing (CMP) in which the silicon nitride film may be used as a polishing-stop layer. After SOI islands are subsequently formed, CMP techniques may be used to planarize the structure such that SOI islands and portions of the silicon substrate are substantially planar.

Figure 2B:
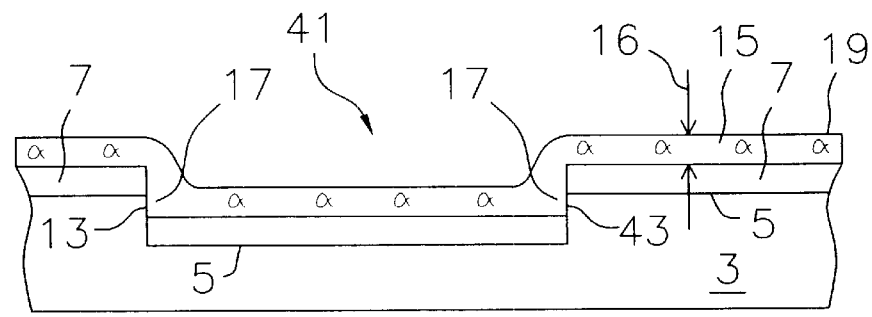

Now turning to FIG. 2B, amorphous silicon film 15 is formed over the substrate and includes adjacent portions 17 which directly contact substrate contact 13 through openings in insulating layer 7 at exposed sidewalls 43 of trench 41.

Figure 2C:
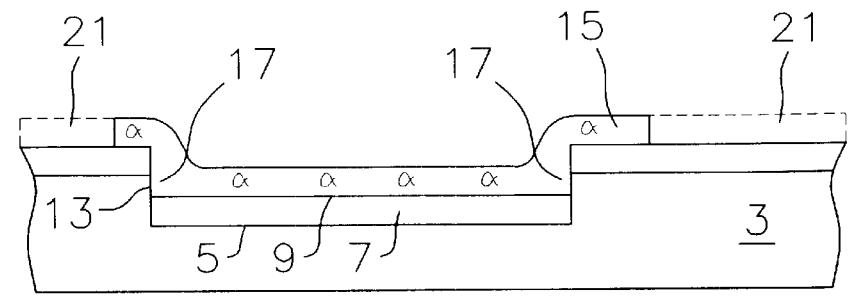

Now turning to FIG. 2C, portions 21 (shown by the ghost pattern of dashed lines) of amorphous silicon film 15 have been removed from over substrate 3. Portions 21 are intended to be exemplary only, and amorphous silicon film 15 which remains on the substrate, may take on different shapes. It may terminate at the edges of trench 41 so long as amorphous silicon film 15 contacts substrate 3 at substrate contacts 13.

Figure 2D:
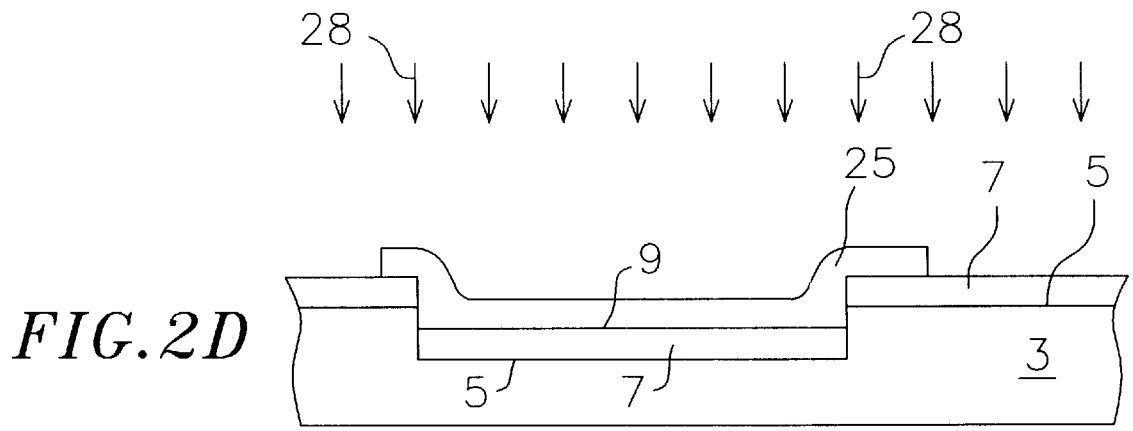

Now referring to FIG. 2D, laser light radiation 28 irradiates the structure in the laser annealing process as described in conjunction with the first exemplary embodiment. Amorphous silicon film 15 is thereby converted to single crystal silicon film 25.

Figure 2E:
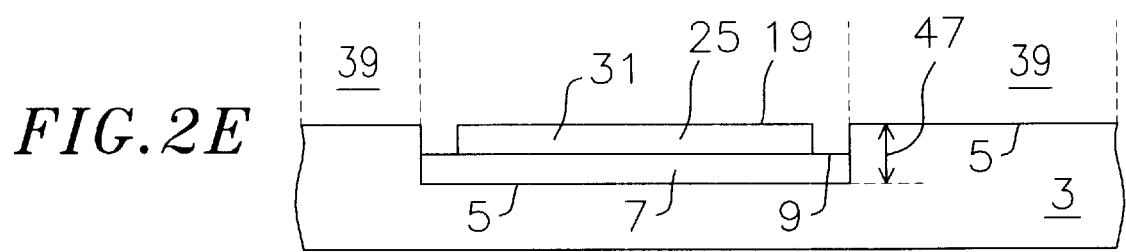

The sections of single crystal silicon film 25 which contact substrate 3 are then removed as shown in FIG. 2E. Any of various suitable conventional methods for selectively removing sections of a silicon film, may be used. After such sections are removed, island 31 of single crystal silicon film 25 remains as an electrically isolated SOI island insulated from substrate 3. Insulating layer 7 may be removed from over substrate surface 5 in exemplary regions 39. Corresponding regions 39 of substrate surface 5, are thereby exposed. Each of regions 39 of substrate surface 5 and SOI island 31 are sized such that semiconductor devices may be formed in or on the surfaces of each.

Various other operation sequences for forming the structure shown in FIG. 2E may be used alternatively. For example, CMP may be used to substantially planarize the structure to insure that upper surface 19 of SOI island 31 and substrate surface 5, are substantially planar such as shown in exemplary FIG. 2E. When such a CMP process is used, various films such as silicon nitride films may be additionally formed to aid in the planarizing process because of their superior quality as polishing stop layers. For example, if depth 47 such as shown in FIG. 2A, is excessive because of additional films formed over substrate surface 5 in regions other than in the trench, an additional silicon nitride film may be formed within trench 41 and over single crystalline film 25, then patterned, to aid in the planarization of the structure. Various other planarization techniques are also contemplated.

Figure 2F:
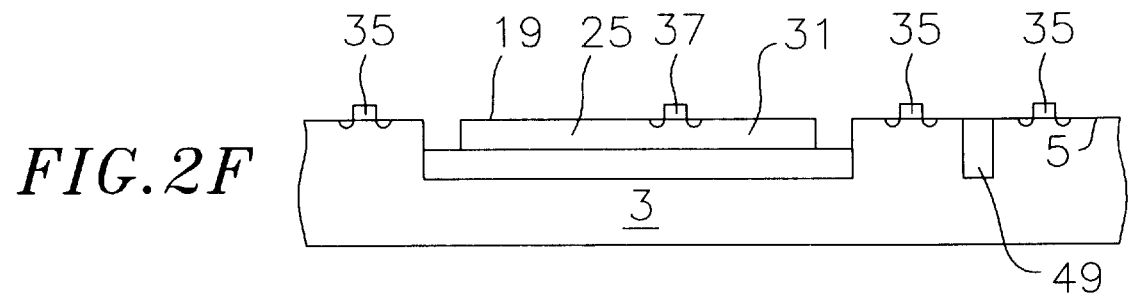

Now turning to FIG. 2F, semiconductor structures are formed on SOI island 31 and substrate surface 5 of substrate 3. Exemplary semiconductor device 37 is shown as formed on SOI island 31 and exemplary semiconductor devices 35 are shown as formed on substrate surface 5 of substrate 3. Devices 35 may be separated by isolation trench 49 in an exemplary embodiment. Conventional processing techniques may be used to form the exemplary structures such as devices 35, 37, and 49 shown in FIG. 2F. Conventional CMOS processing techniques may preferably be used. In an exemplary embodiment, the devices may be formed simultaneously both in substrate surface 5 and SOI island 31. According to another exemplary embodiment, the devices may be formed at separate times. Again, it is emphasized that semiconductor devices 35, 37, and 49 are intended to be exemplary only and that any and all of the various multitude of semiconductor devices, structures, and circuits may be formed on SOI islands 31 of single crystal silicon film 25 and also on substrate surface 5 of substrate 3. Technologies which may be combined using the present invention include analog and digital CMOS, analog and digital bipolar, rf circuitry, embedded memory (DRAM, SRAM, FLASH memory) and other SOI and conventional devices.

For each of the exemplary process sequences and structures formed, it should be understood that the illustrated portions of the substrate represent only a small portion of the substrate and that the process sequence is used to simultaneously form a plurality of similar or identical structures over the substrate. For example, in the exemplary sequence shown in FIGS. 2A–2F, multiple trenches are simultaneously formed in the substrate and processed according to the illustrated sequence.

Although the invention is illustrated and described herein with reference to specific embodiments, the invention is not intended to be limited to the details shown and described. Rather, various modifications may be made in the details within the scope and range of equivalents of the claims and without departing from the invention.

What is claimed is:

1. A method for forming a silicon on insulator (SOI) island over a semiconductor substrate comprising the steps of:

providing a silicon substrate including a trench therein;

forming an insulating layer over said semiconductor substrate and within said trench, but not extending to the top of said trench, said insulating layer therefore including at least one opening exposing a corresponding exposed sidewall of said trench, each exposed sidewall forming a corresponding substrate contact area;

forming an amorphous silicon layer over said insulating layer including within said trench and contacting said at least one corresponding substrate contact area; and converting said amorphous silicon layer to a substantially single crystalline silicon layer using laser annealing.

2. The method as in claim 1, further comprising removing portions of said amorphous silicon layer from over said silicon substrate prior to said step of converting.

3. The method as in claim 2, further comprising removing portions of said insulating layer from over said silicon substrate thereby exposing corresponding portions of said silicon substrate prior to said step of converting and forming semiconductor devices within said corresponding portions of said silicon substrate.

4. The method as in claim 1, in which said step of converting includes utilizing said at least one corresponding substrate contact area as a seed layer which influences the formation of said single crystalline silicon film.

5. The method as in claim 1, further comprising the step of removing sections of said substantially single crystalline silicon layer to produce electrically isolated islands of said substantially single crystalline silicon layer over said insulating layer.

6. The method as in claim 5, in which said step of removing sections of said substantially single crystalline silicon layer to produce electrically isolated sections of said substantially single crystalline silicon layer includes removing sections of said substantially single crystalline silicon layer from said at least one opening after said step of converting.

7. The method as in claim 5, further comprising removing regions of said insulating layer from over corresponding regions of said silicon substrate, said corresponding regions of said silicon substrate sized for forming semiconductor devices at least one of thereon and therein, and sizing said isolated islands of said substantially single crystalline silicon layer to accommodate semiconductor devices being formed at least one of thereon and therein.

8. The method as in claim 1, further comprising the step of planarizing such that respective upper surfaces of said silicon substrate and said substantially single crystalline silicon layer are essentially planar.

9. The method as in claim 1, wherein said laser annealing comprises exposing said silicon substrate to a laser beam having a wavelength and energy fluence chosen to selectively anneal substantially only said amorphous silicon layer.

10. The method of claim 1, in which said laser annealing includes scanning a laser beam over said substrate.

11. The method as in claim 1, in which said step of converting includes substantially said entire substrate being irradiated with radiation from said laser.

12. The method as in claim 11, wherein said silicon substrate includes further structures formed of further materials formed thereon and said further structures are not substantially heated by said laser annealing.

13. The method as in claim 1, wherein said silicon substrate includes a <100> crystalline lattice and said step of converting converts said amorphous silicon layer to substantially <100> crystalline silicon.

14. The method as in claim 1, in which an excimer laser is used for said laser annealing.

15. The method as in claim 14, in which said excimer laser is an XeCl excimer which emits light having a wavelength of approximately 308 nm.

16. The method as in claim 14, wherein said laser annealing comprises said excimer laser emitting radiation having a wavelength at or near the absorption peak of silicon.

17. The method as in claim 14, in which said excimer laser is one of an ArF excimer laser and a KrF excimer laser which emits light having a wavelength of one of approximately 193 nm and 248 nm.

18. The method as in claim 14, in which said step of converting said amorphous silicon layer includes said excimer laser having an energy fluence within the range of 100 to 600 mJ/cm$^2$.

19. The method as in claim 1, in which said laser annealing includes a cooling time and temperature gradient chosen to urge the formation of single crystal silicon from melted silicon.

20. The method as in claim 1, further comprising forming further openings through said insulating layer thereby exposing corresponding portions of a surface of said silicon substrate, said amorphous silicon layer further contacting said corresponding portions of said silicon substrate.

* * * * *